(12) United States Patent
Bauters et al.

(10) Patent No.: US 9,285,540 B2
(45) Date of Patent: Mar. 15, 2016

(54) INTEGRATED DIELECTRIC WAVEGUIDE AND SEMICONDUCTOR LAYER AND METHOD THEREFOR

(71) Applicant: The Regents of the University of California, Oakland, CA (US)

(72) Inventors: Jared Bauters, Santa Barbara, CA (US); John E. Bowers, Santa Barbara, CA (US); Jock Bovington, Goleta, CA (US); Martijn Heck, Aarhus (DK); Michael Davenport, Goleta, CA (US); Daniel Blumenthal, Santa Barbara, CA (US); Jonathon Scott Barton, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/427,748

(22) PCT Filed: Sep. 20, 2013

(86) PCT No.: PCT/US2013/060927
§ 371 (c)(1),
(2) Date: Mar. 12, 2015

(87) PCT Pub. No.: WO2014/047443
PCT Pub. Date: Mar. 27, 2014

(65) Prior Publication Data
US 2015/0226918 A1    Aug. 13, 2015

Related U.S. Application Data

(60) Provisional application No. 61/704,034, filed on Sep. 21, 2012.

(51) Int. Cl.
G02B 6/12        (2006.01)
G02B 6/122      (2006.01)
(Continued)

(52) U.S. Cl.
CPC ............ *G02B 6/1225* (2013.01); *G02B 6/1228* (2013.01); *G02B 6/136* (2013.01);
(Continued)

(58) Field of Classification Search
CPC .... G02B 6/1225; G02B 6/1347; G02B 6/136; G02B 6/12176
USPC ................ 385/14, 88; 372/39, 43; 438/31
See application file for complete search history.

(56) References Cited

U.S. PATENT DOCUMENTS

| 5,657,338 A | 8/1997 | Kitamura |
| 7,146,087 B2 | 12/2006 | Heideman et al. |

(Continued)

OTHER PUBLICATIONS

"Related International Application No. PCT/US2013/060927", "International Search Report and Written Opinion", Dec. 4, 2013, Publisher: PCT—ISA/EPO, Published in: EP.

(Continued)

*Primary Examiner* — Ellen Kim
(74) *Attorney, Agent, or Firm* — Kaplan Breyer Schwarz & Ottesen, LLP

(57) ABSTRACT

A method for realizing a semiconductor waveguide and an ultra-low-loss dielectric waveguide disposed on the same substrate is disclosed. The method includes forming a partial dielectric waveguide structure on the substrate, wherein the dielectric waveguide is annealed to reduce hydrogen incorporation, and wherein the top cladding of the dielectric waveguide is only partially formed by a first dielectric layer. A second substrate comprising a semiconductor layer having a second dielectric layer disposed on its top surface is bonded to the first substrate such that the first and second dielectric layers collectively form the complete top cladding for the dielectric waveguide. The second substrate is then removed and the semiconductor layer is patterned to define the semiconductor waveguide core.

20 Claims, 9 Drawing Sheets

(51) Int. Cl.
H01L 31/105 (2006.01)
G02B 6/30 (2006.01)
G02B 6/136 (2006.01)
G02B 6/134 (2006.01)

(52) U.S. Cl.
CPC ............. *G02B 6/1347* (2013.01); *G02B 6/305* (2013.01); *H01L 31/105* (2013.01); *G02B 2006/12176* (2013.01); *G02B 2006/12188* (2013.01)

(56) References Cited

U.S. PATENT DOCUMENTS

| | | |
|---|---|---|
| 2005/0152660 A1 | 7/2005 | Heideman et al. |
| 2009/0245298 A1 | 10/2009 | Sysak et al. |
| 2009/0304036 A1* | 12/2009 | Iwai .................... H01S 5/18369 372/45.01 |
| 2013/0156364 A1* | 6/2013 | Chen .................. G02B 6/12004 385/14 |

OTHER PUBLICATIONS

Jared F. Bauters, et al, "A Comparison of Approaches for Ultra-Low-Loss Waveguides", "OFC/NFOEC Technical Digest", Jan. 23, 2012, pp. 1-3, Publisher: Optical Society of America; XP-32339943.

Chee-Wei Lee, "A Review of Polarization Dependence Applications for Asymmetric Waveguides Vertical Couplers in Compound Semiconductor Indium Phosphide", "International Journal of Optics", Jun. 22, 2011, pp. 1-11, vol. 2011, Publisher: Hindawi Publishing Corporation.

G. Roelkens, et al, "Efficient Silicon-On-Insulator fiber coupler fabricated using 248nm deep UV lithography", Jul. 2005, pp. 1-3.

"Improved Tolerance in Optical Directional Couplers", Sep. 20, 1973, pp. 453-455, vol. 9, No. 19, Publisher: Electronics Letters.

Yu Kurata, et al, "Heterogeneous integration of high-speed InP PDs on silica-based planar lightwave circuit platform", Jul. 27, 2011, pp. 1-3, Publisher: ECOC Technical Digest.

Chi-Sen Lee et al, "High Temperature Stable Operation of 1.3-um Quantum-Dot Laser Integrated With Single-Mode Tapered Si3N4 Waveguide", Jun. 1, 2012, pp. 918-920, vol. 24, No. 11, Publisher: IEEE Photonics Technology Letters.

Di Liang et al, "Integrated Optoelectronic Devices on Silicon", 2012, vol. 1396, Publisher: Mater. Res. Soc. Symp. Proc.

Anuradha M. Agarwal, et al, "Low-loss polycrystalline silicon waveguides for silicon photonics", Dec. 1, 1996, pp. 6120-5123, vol. 80, No. 11, Publisher: J. Appl. Phys. 80; American Institute of Physics.

Tai Tsuchizawa et al., "Monolithic Integration of Silicon Photonics Devices for Telecommunications Applications", May 2011, pp. 1-10, vol. 9, No. 5, Publisher: NTT Technical Review.

Laura Agazzi, et al, "Monolithic integration of erbium-doped amplifiers with silicon-on-insulator waveguides", Dec. 20, 2010, vol. 18, No. 26, Publisher: Optical Society of America.

Tai Tsuchizawa et al, "Monolithic Integration of Silicon, Germanium, and Silica-Based Optical Devices for Telecommunications Applications", May/Jun. 2011, pp. 516-525, vol. 17, No. 3, Publisher: IEEE Journal of Selected Topics in Quantum Electronics.

Jared F. Bauters et al., "Planar waveguides with less than 0.1 dB/m propagation loss fabricated with wafer bonding", 2011, Publisher: Optical Society of America.

Long Chen, et al , "Polarization-Diversified DWDM Receiver on Silicon Free of Polarization-dependentWavelength Shift", Jan. 23, 2012, Publisher: OFC/NFOEC Technical Digest.

Erik J. Skogen et al, "Postgrowth Control of the Quantum-Well Band Edge for the Monolithic Integration of Widely Tunable Lasers and Electroabsorption Modulators", Jul. 22, 2003, pp. 1-8.

Jared F. Bauters et al., "Ultra-low-loss high-aspect-ratio Si3N4 waveguides", Feb. 14, 2011, pp. 3163-3174, vol. 19, No. 4, Publisher: Optical Society of America.

* cited by examiner

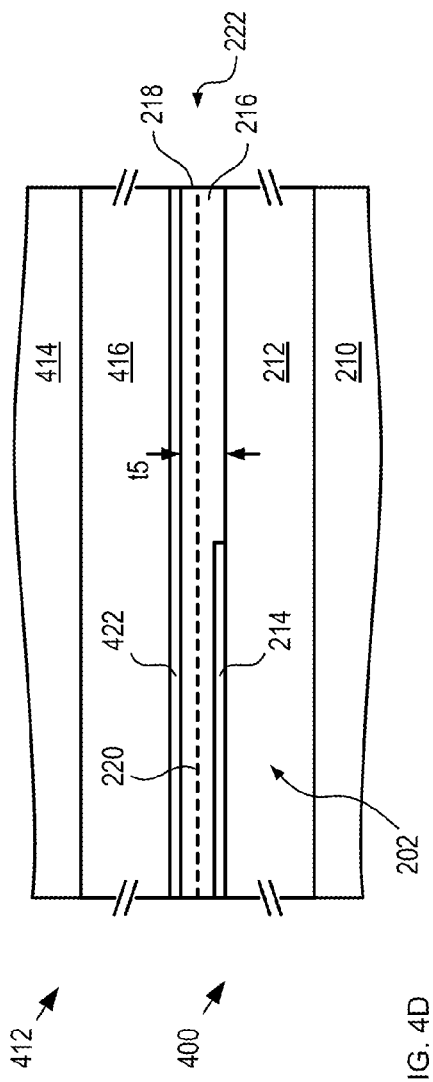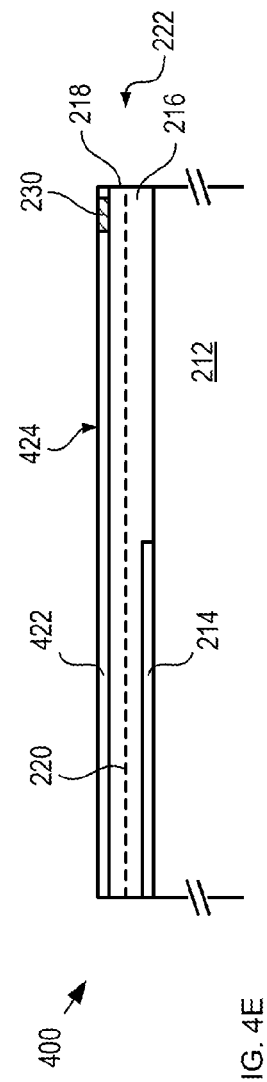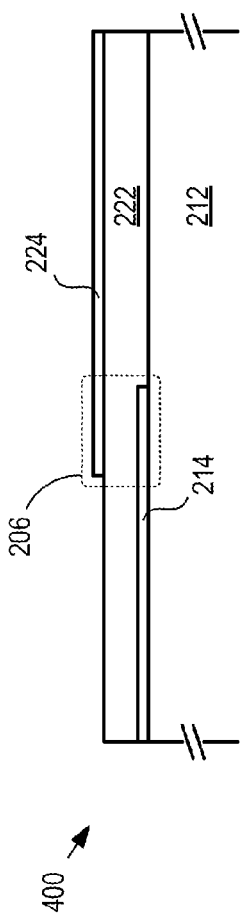

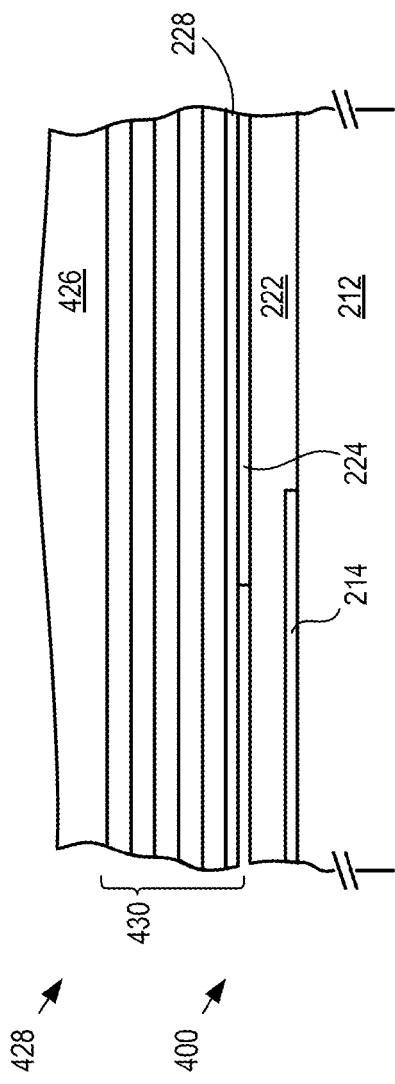
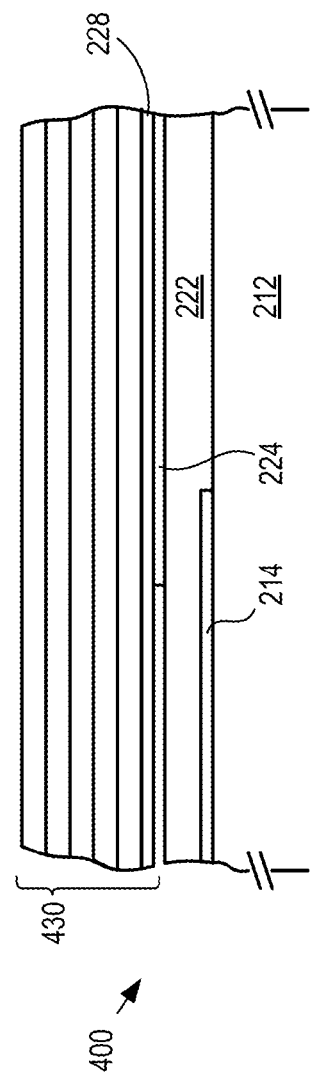

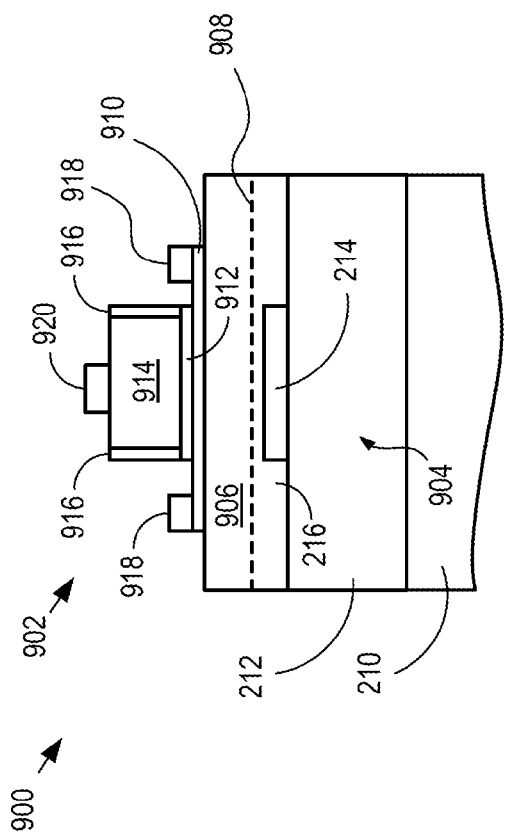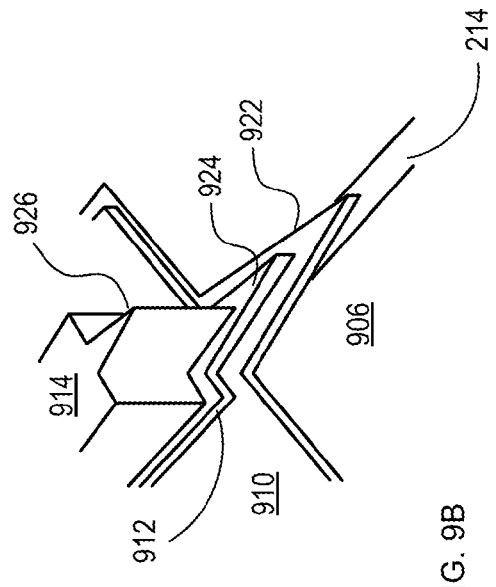
FIG. 9A
FIG. 9B

INTEGRATED DIELECTRIC WAVEGUIDE AND SEMICONDUCTOR LAYER AND METHOD THEREFOR

STATEMENT REGARDING FEDERALLY SPONSORED RESEARCH

This invention was made with Government support under Contract HR0011-09-C-0123 awarded by Defense Advanced Research Projects Agency (DARPA). The Government has certain rights in the invention.

FIELD OF THE INVENTION

The present invention relates to silicon-based photonics in general, and, more particularly, to the integration of low-loss, integrated-optic waveguides with a semiconductor layer suitable for forming semiconductor waveguides, active electronic devices, and active and passive photonic devices.

BACKGROUND OF THE INVENTION

Silicon-based photonics has grown to include dielectric waveguides, as well as silicon waveguides. A dielectric waveguide carries light in a central core made of an amorphous dielectric material, such as silicon nitride or silicon dioxide, and is typically formed on a silicon substrate. A silicon waveguide carries light in a core made of pure single-crystal silicon, which is typically formed from the active region of a silicon-on-insulator (SOI) wafer.

Though developed separately, some properties of these two waveguide technologies are complementary. For example, relative to silicon waveguides, dielectric waveguides can be optically coupled with optical fibers with less loss, exhibit lower propagation loss, and are generally less sensitive to perturbations. In addition, dielectric waveguides can carry light signals over a wide spectral bandwidth that includes the ultraviolet, visible, and near-infrared wavelength ranges. Further, dielectric waveguides can be fabricated such that they exhibit extremely low optical propagation loss (i.e., "ultra-low-loss waveguides"). Silicon waveguides, on the other hand, offer tighter bend radii and can be integrated with modulators, detectors, and CMOS electronics.

Historically, the choice of waveguide technology has been based upon the specific needs of the application in which it was to be used. In applications more sensitive to optical loss or that required large wavelength bandwidth, for example, dielectric waveguides have typically been selected. In applications where chip real-estate was a premium, or integration with electronic or active photonic devices was desired, silicon waveguides have been preferred.

Recently, complementary properties of these waveguide technologies have been combined in a single chip by forming dielectric waveguides on substrates on which silicon waveguides, silicon electronics, and compound semiconductor devices have previously been fabricated. Unfortunately, integration of these disparate waveguide technologies, using methods of the prior art, requires compromises in waveguide and/or device performance.

As-deposited dielectric-waveguide materials are characterized by high hydrogen concentration, which gives rise to optical propagation loss. As a result, after a dielectric waveguide is defined, it must be annealed at high-temperature (typically above 900° C.) to reduce hydrogen concentration to achieve low optical loss. Electronic and photonic devices are extremely sensitive to temperature, however. For example, exposure to high temperature can damage the doped regions of electrically active devices (used to form p-n junctions, electrical connections, etc.). In addition, electrically active devices are normally interconnected via metal traces, which cannot be subjected to high temperatures. Further, compound semiconductor epitaxial layers are also damaged by the high temperature processing and annealing required to produce low-loss dielectric waveguides. These factors preclude the use of the high-temperature annealing necessary to produce low-loss dielectric waveguides formed on a substrate that contains active electrical devices. As a result, prior-art dielectric/silicon waveguide integration platforms have been limited to low temperature processes in which dielectric waveguides are not annealed.

To further complicate matters, it is difficult to provide a lower cladding for the integrated dielectric waveguide that has thickness sufficient to optically isolate the dielectric waveguides from the silicon-waveguide substrate. The thickness of this lower cladding is limited to the thickness of the buried oxide (BOX) layer of the underlying SOI substrate plus the thickness of the silicon dioxide layer formed between the silicon waveguide and the dielectric waveguide core. Unfortunately, thick BOX layers are difficult to fabricate and are, therefore, costly. As a result, prior-art dielectric waveguides integrated with silicon waveguides normally exhibit significant optical loss due to light leakage into the underlying substrate.

A waveguide integration platform capable of integrating low-loss dielectric waveguides with silicon and/or compound semiconductor waveguides would be a significant advance in the state of the art.

SUMMARY OF THE INVENTION

The present invention mitigates some of the costs and disadvantages of the prior art. Specifically, the present invention enables wafer-scale integration of ultra-low-loss waveguides with silicon and/or compound semiconductor waveguides on a common substrate. Embodiments of the present invention are particularly well suited for applications such as optical telecommunications, data communications, and the like.

In the prior-art, dielectric waveguides have been integrated with silicon waveguides by forming the dielectric waveguides on SOI or compound semiconductor substrates having previously formed silicon waveguides and photonic devices (e.g., photodetectors, variable optical attenuators, etc.). Unfortunately, process considerations associated with these prior-art integration approaches preclude the fabrication of dielectric waveguides having low optical loss. In addition, the processing necessary to form low-loss dielectric waveguides (e.g., photolithography, tightly controlled etching, etc.) on substrates having pre-formed silicon waveguides is complicated by topography introduced by the silicon waveguide structure.

In contrast to the prior art, embodiments of the present invention enable a process wherein the formation of silicon and/or compound semiconductor waveguides, photonic devices, and/or electronic devices is performed after dielectric waveguides have been fully formed and annealed. The present invention, therefore, enables integration of low-loss dielectric waveguides with:
  i. silicon waveguides; or
  ii. silicon electronics; or
  iii. compound semiconductor materials (e.g., InGaAsP, InGaAlAs, ZnSe, ZnS, etc.); or
  iv. compound semiconductor devices; or
  v. photonic devices (e.g., lasers, detectors, modulators, amplifiers, etc.)

vi. other silicon materials (e.g., silicon-germanium, porous silicon, etc.) or vii. any combination of i, ii, iii, iv, v, and vi.

An illustrative embodiment of the present invention is a photonic integrated circuit (PIC) having a low-loss dielectric waveguide that is optically coupled with a heterogeneous silicon laser via a silicon waveguide. The PIC is fabricated by partially forming a low-loss dielectric waveguide structure on a first substrate. This partially formed structure includes a lower cladding, a silicon nitride core (fully annealed to reduce its hydrogen content), and a first silicon dioxide layer that defines a first portion of the upper cladding of the dielectric waveguide. A second substrate (a semiconductor-on-insulator substrate having a silicon active layer) is then oxidized to form a second layer of silicon dioxide on the top surface of the active layer. The first and second layers of silicon dioxide are then bonded to join the first and second substrates, as well as complete the top cladding of the dielectric waveguide. After bonding, the handle wafer and BOX layer of the SOI substrate are removed to expose the active layer for further processing. The active layer is then patterned to form a silicon waveguide that is optically coupled with the dielectric waveguide. Finally, a compound semiconductor structure is bonded to the silicon waveguide and processed to define a hybrid-silicon evanescent laser that is optically coupled with the silicon waveguide.

In some embodiments, silicon electronics (e.g., CMOS transistors and circuits, partially or fully depleted CMOS devices, device drivers, etc.) are formed in the active layer after it has been bonded with the first substrate.

In some embodiments, the active layer is a material other than silicon, such as a silicon compound (e.g., silicon germanium, silicon carbide, etc.), a compound semiconductor, and the like.

In some embodiments, the silicon waveguide includes a vertical coupler for facilitate optically coupling between the dielectric and silicon waveguides.

In some embodiments, the active layer is bonded directly onto an ultra-low-loss dielectric waveguide using plasma-assisted bonding.

In some embodiments, a deposited silicon nitride or silicon oxide layer is first deposited on the active layer and then bonded directly onto an ultra-low-loss dielectric waveguide using a wafer-bonding technique, such as plasma-assisted bonding.

In some embodiments, a compound semiconductor structure is bonded directly onto an ultra-low-loss dielectric waveguide using plasma-assisted bonding. In some embodiments, the compound semiconductor structure is processed after bonding to form integrated active devices such as lasers, modulators, and photodetectors.

An embodiment of the present invention is a method comprising: providing a first waveguide structure comprising; (a) a lower cladding layer having a first refractive index; (b) a first waveguide core disposed on the lower cladding layer, wherein the first waveguide has a first surface and a second refractive index that is higher than the first refractive index; and (c) a first dielectric layer disposed on the first surface, wherein the first dielectric layer has a second surface and a third refractive index that is lower than the second refractive index; providing a second dielectric layer having a third surface and a fourth refractive index that is lower than the second refractive index; and bonding the second surface and the third surface at a bonded interface such that the first dielectric layer and the second dielectric layer collectively define an upper cladding layer for the first waveguide core; wherein the lower cladding layer, the first waveguide core, and the upper cladding layer collectively define a first waveguide.

BRIEF DESCRIPTION OF THE DRAWINGS

FIG. 4A-H depict schematic drawings of cross-sectional views of a portion of PIC 200 at different points in its fabrication.

FIG. 9A depicts a schematic diagram of a cross-sectional view of a photonic device integrated with a silicon dioxide cladding layer in accordance with a second alternative embodiment of the present invention.

FIG. 9B depicts a schematic drawing of a perspective view of a vertical coupler suitable for optically coupling device 902 and waveguide 904.

DETAILED DESCRIPTION

The following terms are defined for use in this Specification, including the appended claims:

dielectric waveguide is defined as a waveguide comprising a waveguide core made of a material other than pure silicon. Examples of materials suitable for use in the waveguide core of a dielectric waveguide include, without limitation, silicon oxides (e.g., doped or undoped silicon dioxide, $SiO_x$, etc.), silicon nitride, silicon oxynitride, silicon carbide, hafnium oxide, aluminum oxide, and silica.

cladding layer is defined as a layer that is dimensioned and arranged to at least partially confine a propagating optical mode to a waveguide core. A cladding layer typically comprises a material that has a refractive index that is lower than that of the material of the waveguide core.

heterogeneous silicon device is defined as a photonic device that includes a compound semiconductor layer structure that is heterogeneously integrated with a silicon layer or substrate by means of wafer bonding such that the combined structure can have the functionality of both compound semiconductors and silicon. Heterogeneous silicon devices are often formed by integrating a compound semiconductor layer stack with the single-crystal silicon active layer of a conventional silicon-on-insulator substrate. In some cases, a heterogeneous silicon device supports an optical mode that exists in both the compound semiconductor layer stack and the silicon to which it is bonded. In some cases, a heterogeneous silicon device supports an optical mode that exists primarily in the compound semiconductor layer stack. Heterogeneous silicon devices are defined to include devices referred to in the prior art as: hybrid silicon devices, hybrid silicon photonic devices, hybrid silicon evanescent devices, silicon evanescent devices, and the like.

Figure 1:
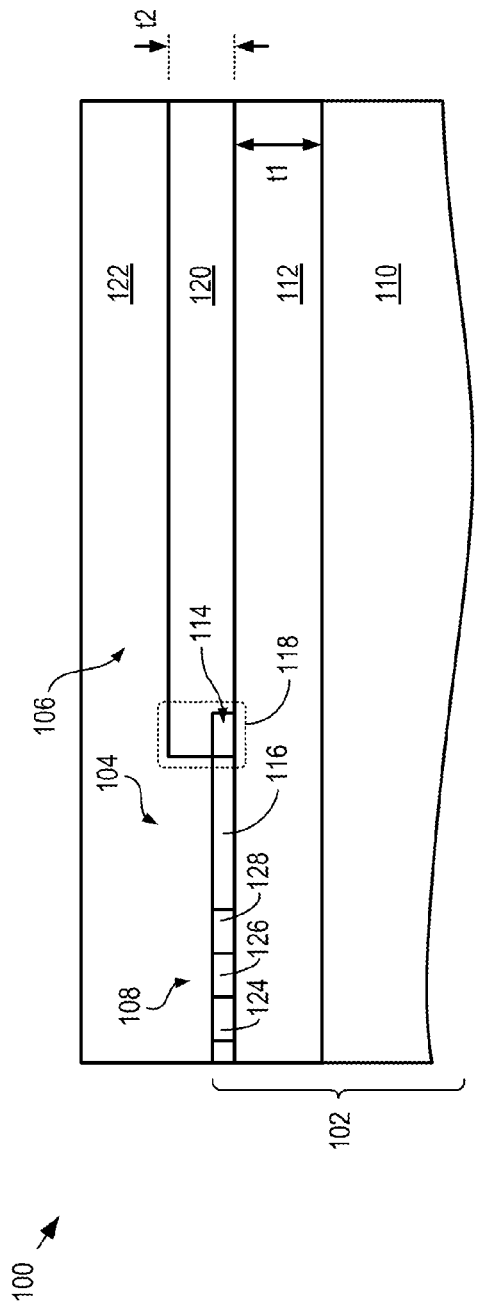
FIG. 1 depicts a schematic diagram of cross-sectional view of a portion of an integrated waveguide system in accordance with the prior art.

FIG. 1 depicts a schematic diagram of cross-sectional view of a portion of an integrated waveguide system in accordance with the prior art. System 100 comprises silicon waveguide 104, dielectric waveguide 106, and attenuator 108. System 100 is analogous to integrated waveguide systems disclosed by Tsuchizawa, et al., in "Monolithic Integration of Silicon-, Germanium-, and Silica-Based Optical Devices for Telecommunications Applications," IEEE Journal of Selected Topics in Quantum Electronics, Vol. 17, pp. 516-525 (2011), which is incorporated herein by reference.

Silicon waveguide 104 is a conventional silicon waveguide whose core is defined from the silicon active layer of SOI substrate 102.

SOI substrate 102 is a typical silicon-on-insulator substrate comprising handle substrate 110, BOX layer 112, and active layer 114.

BOX layer 112 is a layer of silicon dioxide having a thickness, t1, of approximately 3 microns and a refractive index of approximately 1.44. BOX layer 112 serves as the lower cladding for silicon waveguide 104.

Active layer 114 is a layer of single-crystal silicon having a thickness of approximately 300 nm. Active layer 114 is patterned via reactive-ion etching (RIE) to define the desired shape of silicon waveguide core 116. Active layer 114 is doped with n-type and p-type impurities to form p+diffusion region 124 and $n^+$ diffusion region 128. $P^+$ diffusion region 124, $n^+$ diffusion region 128, and intrinsic region 126 collectively define variable optical attenuator (VOA) 108. Active layer 114 is also patterned to form vertical coupler 118.

One skilled in the art will recognize that the principle driver for the continuing development of SOI substrates is their use in electronic integrated circuits, which has made a distinct move toward fully depleted transistor technology. As a result, the trend for SOI configurations is toward a very thin silicon active layer (<30 nm). The trend is also moving toward thin BOX layers, since the BOX thickness typically scales with transistor gate length. The typical thickness for BOX layers of SOI substrates in volume production is within the range of 100-200 nm. Although SOI substrates having BOX layers with thickness greater than 10 microns can be obtained, they are significantly more expensive.

Dielectric waveguide 106 comprises BOX layer 112, dielectric waveguide core 120, and cladding layer 122.

Dielectric waveguide core 120 is patterned from an approximately 3 micron-thick layer of doped silicon oxide, $SiO_x$, deposited via plasma-enhanced chemical vapor deposition to form a waveguide core having a roughly square cross-sectional shape. The refractive index of dielectric waveguide core 120 is approximately 1.48, which results in an index contrast with BOX layer 112 of approximately 3%. Dielectric waveguide core 120 overlaps silicon waveguide core 116 at vertical coupler 118, which enables optical coupling between the two waveguide cores.

Cladding layer 122 is a layer of low-temperature silicon dioxide formed over silicon waveguide core 116, BOX layer 112 and dielectric waveguide core 120. Cladding layer 122 is planarized to a final thickness, t2, of approximately 3 microns and has a refractive index of approximately 1.44.

Although system 100 does enable optical coupling between a silicon waveguide and a dielectric waveguide, its fabrication is not amenable to forming a dielectric waveguide having low loss.

Since dielectric waveguide 106 is formed after definition of silicon waveguide 104 and attenuator 108, the thermal budget available for the processes used to form the dielectric waveguide is extremely limited. For example, in order to avoid the high temperatures associated with low-pressure chemical vapor deposition (LPCVD), plasma-enhanced chemical vapor deposition (PECVD) is used to deposit the SiOx layer from which dielectric waveguide core 120 is formed. For the same reason, cladding layer 122 must be formed using a low-temperature process, such as spin-on glass. Such films have low density and poor overall quality by comparison to LPCVD-deposited layers. Further, low-temperature deposition processes are notorious for the inclusion of undesirable impurities, such as hydrogen, which gives rise to high optical propagation losses in the materials. The limited thermal budget also precludes a post-deposition anneal that would normally be used to densify these films and reduce hydrogen concentration.

Second, BOX layer 112 serves the lower cladding for both silicon waveguide 104 and dielectric waveguide 106. Unfortunately, as discussed above, BOX layer 112 typically has a thickness of only about 3 microns, which is insufficient to prohibit optical energy of a signal propagating in dielectric waveguide 106 from leaking into substrate 110—particularly for a waveguide having an index contrast of only about 3%.

In contrast to the prior-art, the present invention integrates semiconductor waveguides and dielectric waveguides by fabricating the semiconductor waveguides after dielectric waveguides have been fully formed and annealed on a common substrate. As a result, dielectric waveguides in accordance with the present invention can have significantly better optical propagation characteristics than dielectric waveguides integrated with silicon waveguides via prior-art approaches. For example, dielectric waveguides in accordance with the present invention can have optical propagation loss that is less than 1 dB/m. In some embodiments, the present invention enables dielectric waveguides that are ultra-low-loss waveguides having optical propagation loss that is less than or equal to 0.1 dB/m.

Figure 2:
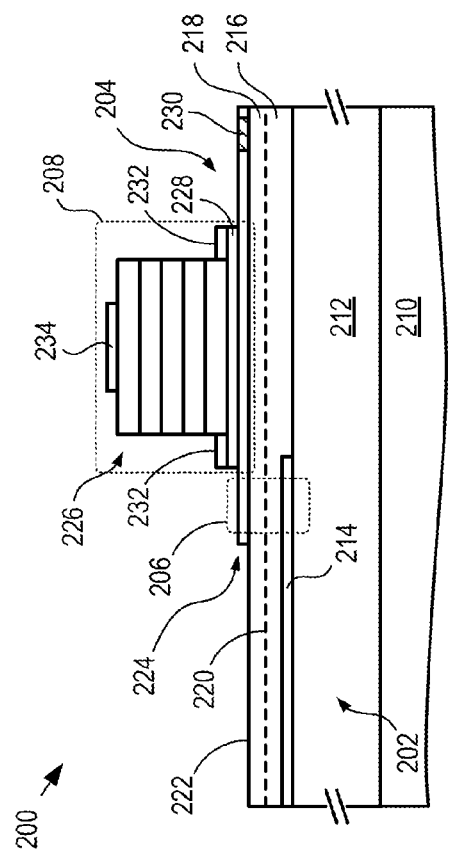
FIG. 2 depicts a schematic drawing of a cross-sectional view of a portion of a photonic integrated circuit in accordance with an illustrative embodiment of the present invention.

FIG. 2 depicts a schematic drawing of a cross-sectional view of a portion of a photonic integrated circuit in accordance with an illustrative embodiment of the present invention. PIC 200 comprises ultra-low-loss dielectric waveguide 202, semiconductor waveguide 204, vertical coupler 206, and heterogeneous silicon device 208. It should be noted that, although the illustrative embodiment comprises a PIC having only one dielectric waveguide and one semiconductor waveguide, it will be clear to one skilled in the art, after reading this Specification, how to specify, make, and use alternative embodiments of the present invention that include any number of dielectric or semiconductor waveguides, where waveguides of the same time are arranged at the same, or different, heights above a common substrate.

Dielectric waveguide 202 is an ultra-low-loss waveguide that includes lower cladding 212, dielectric core 214, and cladding layer 222. For the purposes of this Specification, including the appended claims, an "ultra-low-loss waveguide" is defined as a waveguide having optical propagation loss less than or equal to 0.1 dB/meter.

Although in the illustrative embodiment dielectric waveguide 202 is an ultra-low-loss waveguide, it will be clear to one skilled in the art, after reading this Specification, how to specify, make, and use alternative embodiments wherein dielectric waveguide 202 is other than an ultra-low-loss waveguide—for example, waveguides having optical propagation loss that is greater than 0.1 dB/meter. It should be noted, however, that the present invention offers particular advantage to those embodiments that include waveguides that benefit from long and/or high-temperature anneals.

Semiconductor waveguide 204 includes cladding layer 222 and waveguide core 224.

Figure 3:
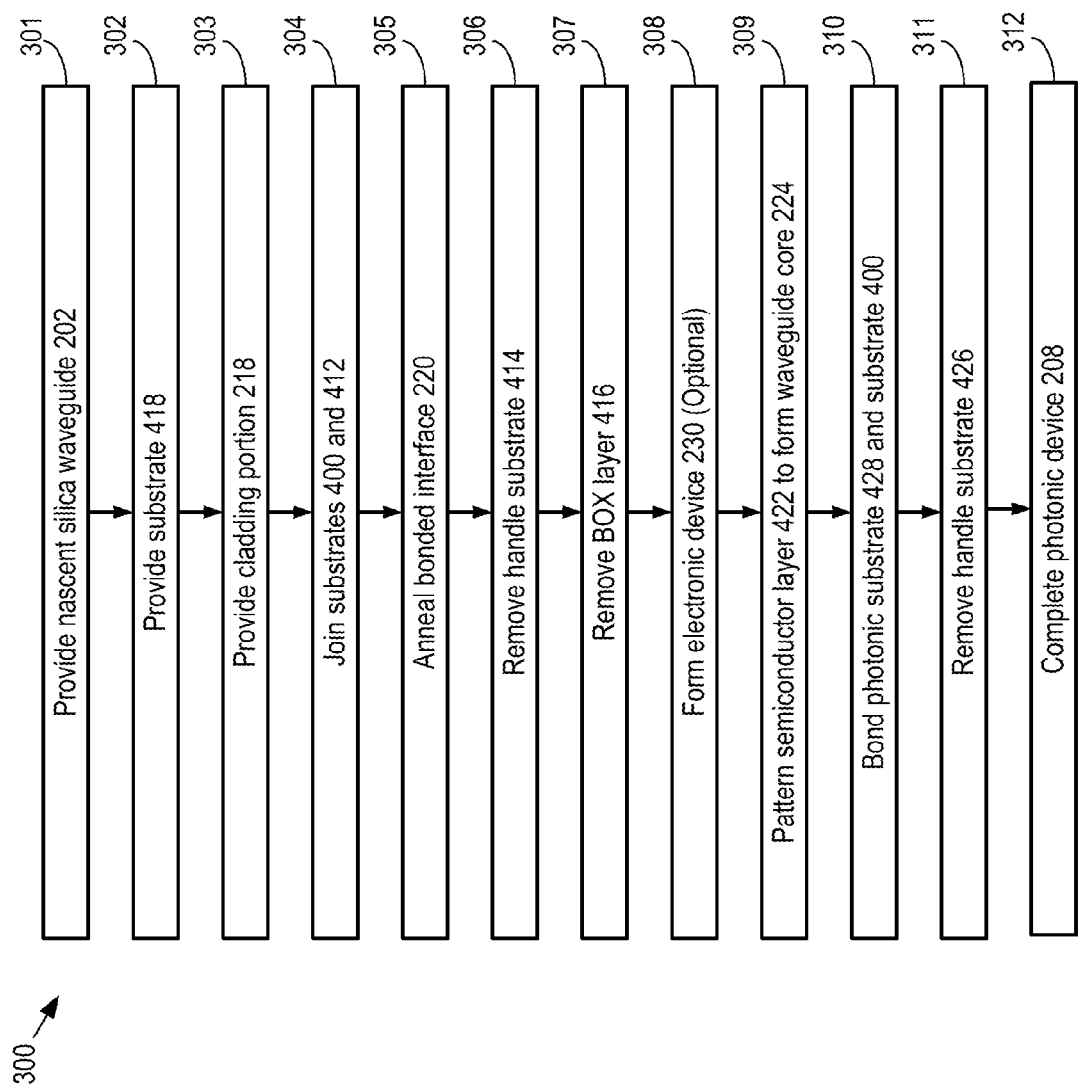
FIG. 3 depicts operations of a fabrication method suitable for forming a photonic integrated circuit in accordance with the illustrative embodiment of the present invention.

FIG. 3 depicts operations of a fabrication method suitable for forming a photonic integrated circuit in accordance with the illustrative embodiment of the present invention. Method 300 begins with operation 301, wherein a first substrate comprising a partially formed dielectric waveguide is provided.

Figure 4A:
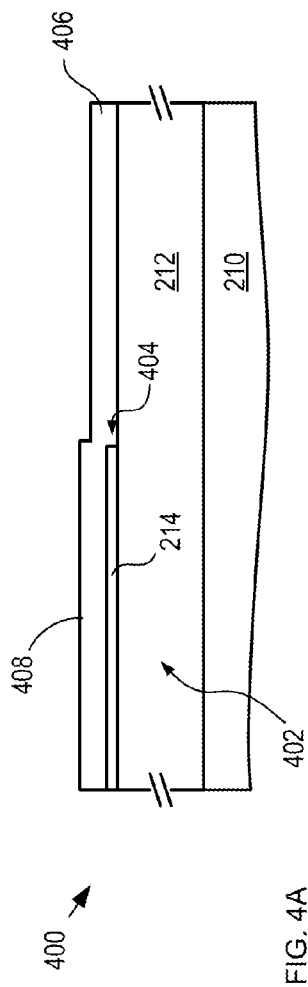

FIG. 4A depicts a schematic drawing of a cross-sectional view of a portion of substrate 400. Substrate 400 comprises substrate 210, lower cladding 212, dielectric core 214, and nascent cladding layer 406. Lower cladding 212, dielectric core 214, and nascent cladding layer 406 collectively define nascent dielectric waveguide 402.

Figure 5:
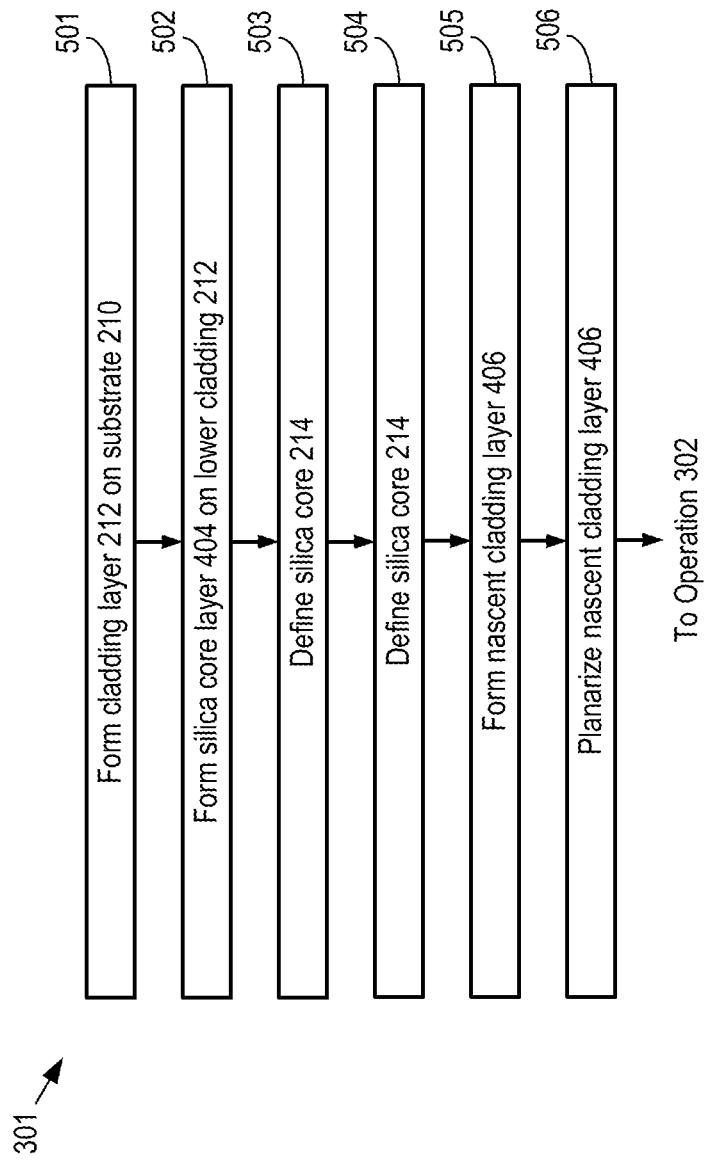
FIG. 5 depicts sub-operations suitable for providing nascent dielectric waveguide 402 in accordance with the illustrative embodiment of the present invention.

FIG. 5 depicts sub-operations suitable for providing nascent dielectric waveguide 402 in accordance with the illustrative embodiment of the present invention. Operation 301 begins with sub-operation 501, wherein cladding layer 212 is formed on substrate 210.

Substrate 210 is a conventional silicon substrate suitable for use with planar processing technologies and, specifically, the fabrication of dielectric waveguides. In some embodiments, substrate 210 comprises a material other than silicon. Materials suitable for use in substrate 210 include, without limitation, glass, fused silica, germanium, a silicon compound (e.g., silicon germanium, silicon carbide, etc.), a compound semiconductor, and the like.

Lower cladding 212 is a layer of silicon dioxide that is thermally grown on the top surface of substrate 210 to a thickness of approximately 15 microns. It will be clear to one skilled in the art that lower cladding can have any suitable thickness, however. In some embodiments, lower cladding 212 is a layer of a dielectric other than silicon dioxide. In some embodiments, lower cladding 212 is a layer of silicon oxide formed via a technique other than thermal oxidation, such as TEOS-based LPCVD, and the like.

At sub-operation 502, dielectric core layer 404 is deposited on lower cladding 212. Dielectric core layer 404 is a layer of LPCVD-deposited silicon nitride having a thickness within the range of approximately 20 nm to approximately 1 micron, and preferably within the range of approximately 30 nm to 100 nm. In the illustrative embodiment, dielectric core layer 404 is deposited such that it has a thickness of approximately 40 nm.

At sub-operation 503, dielectric core layer 404 is patterned via photolithography and RIE to define dielectric core 214. Dielectric core 214 has a width within the range of approximately 1 microns to approximately 20 microns.

One skilled in the art will recognize that dielectric core 214 can have any suitable practical dimensions, and the that the dimensions of dielectric core 214 depend on the intended application for PIC 200, the desired modal properties of light signals that propagate through the waveguide, and the intended operating wavelengths for the PIC 200.

Although in the illustrative embodiment, dielectric core 214 comprises silicon nitride, it will be clear to one skilled in the art, after reading this Specification, how to specify, make, and use alternative embodiments of the present invention wherein dielectric core 214 comprises a material other than silicon nitride. Materials suitable for use in dielectric core 214 include, without limitation, silicon oxides (e.g., doped or undoped silicon dioxide, $SiO_x$, etc.), silicon nitride, silicon oxynitride, silicon carbide, silicon germanium, hafnium oxide, aluminum oxide, silica, and the like. In some embodiments, dielectric waveguide 202 comprises a multi-layer core, such as waveguide cores described in U.S. Pat. No. 7,146,087, which is incorporated herein by reference.

At sub-operation 504, dielectric core 214 is annealed (e.g., at 950° C. for several hours) to reduce its hydrogen concentration and increase its density.

At sub-operation 505, nascent cladding layer 406 is formed over patterned dielectric core 214. Nascent cladding layer 406 is a layer of TEOS-based LPCVD-deposited silicon dioxide having a typical thickness within the range of approximately 0.3 microns to approximately 5 microns. In some embodiments, nascent cladding layer 406 is formed by multiple depositions of sub-layers whose combined thickness is equal to that of nascent cladding layer 406. Because TEOS-based LPCVD is a substantially conformal coating process, nascent cladding layer 406 includes protrusion 408 above dielectric core 214.

In some embodiments, nascent cladding layer 406 comprises a material other than TEOS-based LPCVD-deposited silicon dioxide. Suitable materials for use in nascent cladding layer 406 include, without limitation, low-temperature deposited silicon dioxide, spin-on glass, plasma-enhanced-chemical-vapor-deposition (PECVD) dielectrics, glasses (e.g., borophosphosilicate glass, phosphosilicate glass, etc.), silicon oxides and silicon oxynitride.

Further details of suitable methods for fabrication of ultra-low-loss dielectric waveguides are disclosed by Bauters, et al., in "Ultra-low-loss high-aspect-ratio $Si_3N_4$ waveguides," Optics Express, Vol. 19, pp. 3163-3174 (2011), which is incorporated herein by reference.

At operation 506, nascent cladding layer 406 is polished via chemical-mechanical polishing (CMP) to remove protrusion 408 and planarize the layer. Once planarized, the thickness of nascent cladding layer 406 above dielectric core 214 is equal to t3 (in the illustrative embodiment, t3 is approximately 3.1 microns). Typically, nascent cladding layer 406 is annealed in order to drive out hydrogen and other impurities accumulated during the polishing process to complete the formation of cladding portion 216. In some embodiments, nascent cladding layer 406 is planarized via another suitable planarization process, such as glass reflow, etc.

Figure 4B:
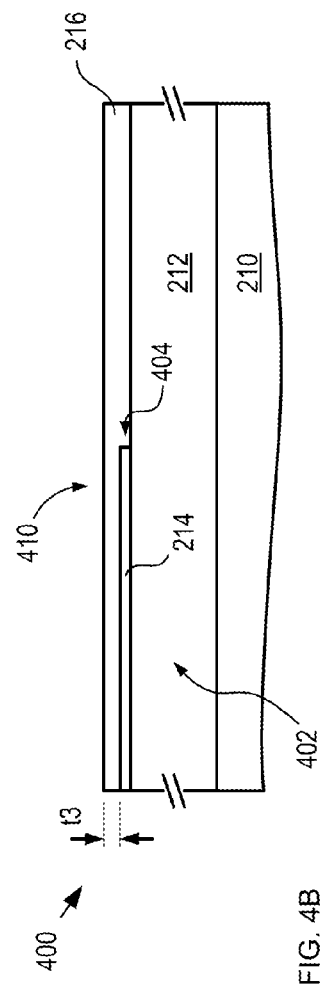

FIG. 4B depicts cladding portion 216 disposed on substrate 400.

Returning now to method 300, at operation 302, substrate 412 is provided.

Substrate 412 is a semiconductor-on-insulator substrate comprising conventional silicon handle substrate 414, conventional BOX layer 416, and active layer 418. In some embodiments, substrate 412 includes a handle substrate other than silicon, such as a compound semiconductor substrate. In some embodiments, substrate 412 includes a separation layer, an ion-implanted layer (analogous to the layer employed in the SmartCut process used for SOI substrate fabrication), or a stop-etch layer in place of BOX layer 416.

Active layer 418 is a layer of single-crystal silicon typically having a thickness of approximately 0.2-1.0 microns. In some embodiments, active layer 418 is a material other than silicon that is suitable for guiding an optical signal at the wavelength of operation for PIC 200. Materials suitable for use in active layer 418 include, without limitation, compound semiconductors, silicon compounds, germanium, and the like.

At operation 303, cladding portion 218 is provided.

Cladding portion 218 is provided by thermally oxidizing active layer 418 to form an oxide layer having thickness t4 and top surface 420. Although the value of t4 is a matter of design choice, exemplary values for t4 are within the range of a few nm to several microns. The non-oxidized portion of active layer 418 remains as semiconductor layer 422. In some embodiments, cladding portion 218 is a layer of dielectric material formed on active layer 418, where the dielectric material is suitable for use as cladding material, as well as for bonding with cladding portion 216.

At operation 304, substrates 400 and 412 are joined at bonded interface 220 via wafer bonding (preferably oxygen-plasma-assisted bonding). The bonding process begins by exposing surfaces 410 and 420 to an oxygen plasma to activate them and provide suitable surface termination. Surfaces 410 and 420 are then brought into physical contact at room temperature to form bonded interface 220.

At operation 305, bonded interface 220 is annealed at an elevated temperature (e.g., 950° C.) for a suitable period of time (e.g., 3 hours) to improve its strength and quality.

Although oxygen-plasma-assisted bonding is the preferred method for joining substrates 400 and 412, it will be clear to one skilled in the art, after reading this Specification, how to specify, make, and use alternative embodiments of the present invention wherein a different wafer bonding technique is used to join the substrates. Exemplary bonding methods suitable for joining substrates 400 and 412 include, without limitation, fusion bonding, thermo-anodic bonding, argon-plasma-assisted bonding, BenzoCycloButene (BCB) bonding, and the like.

Cladding portions 216 and 218 collectively form a substantially continuous layer of silicon dioxide that collectively defines cladding layer 222. Cladding layer 222 serves as the upper cladding layer for dielectric waveguide 202 and an inter-waveguide cladding between dielectric core 214 and waveguide core 224. Cladding layer 222 has thickness t5, which is approximately equal to the combined thicknesses t3 and t4.

It should be noted that the thickness of a thermally grown silicon dioxide can be controlled with extremely high precision. It is an aspect of the present invention, therefore, that the thickness of cladding layer 222 can be adjusted to enable precise control over the final thickness, t5, of cladding layer 222 (i.e., the spacing between dielectric core 214 and waveguide core 224) by controlling the thermal oxidation of active layer 418. For example, by measuring the thickness of cladding portion 216 prior to oxidizing active layer 418, the growth of the thermal oxide can be precisely tailored to match the thickness differential between thickness t3 and the desired thickness t5. In embodiments wherein active layer 418 comprises a material other than single-crystal silicon, a controlled deposition of dielectric can be performed on the active layer before wafer bonding.

FIG. 4D depicts a portion of bonded substrates 400 and 412.

At operation 306, handle substrate 414 is removed via a conventional method, such as a combination of mechanical lapping/polishing and silicon-selective RIE, a Smartcut process, and the like. One skilled in the art will recognize that myriad ways to remove substrate 414 are known.

At operation 307, BOX layer 416 is removed via a conventional method, such as a selective wet etch (e.g., hydrofluoric acid, etc.) or RIE.

FIG. 4E depicts a portion of substrate 400 after removal of substrate 414 and BOX layer 416.

It should be noted that, after operation 307, semiconductor layer 422 retains the high-quality of a single-crystal silicon layer. Further, this high-quality semiconductor layer is disposed on a high-quality layer of thermal oxide (i.e., cladding portion 218). As a result, the present invention enables the formation of semiconductor waveguides, active and passive electrical devices, partially and/or fully depleted CMOS devices, and active and passive photonic devices that can be of similar quality to those formed on more conventional substrates.

It should also be noted that the thickness control for semiconductor layer 422 is quite good, since it retains the precise thickness tolerance associated with both conventional SOI wafer technology and thermal oxidation. In addition, surface 424 is exceptionally smooth by virtue of its formation during the fabrication of SOI substrate 412. Typical RMS roughness for surface 424 is approximately 1-4 nm, which is sufficiently smooth to enable low-temperature bonding of the surface with III-V epitaxial wafers, as described below.

At optional operation 308, electronic device 230 is formed in semiconductor layer 422.

At operation 309, semiconductor layer 422 is patterned to form waveguide core 224 and vertical coupler 206. In some embodiments, semiconductor layer 422 is patterned to also include passive optical elements, such arrayed-waveguide gratings, directional couplers, splitters, etc. Semiconductor layer 422 is typically patterned using RIE. In some embodiments, vertical coupler 206 is a grating coupler. In some embodiments, vertical coupler 206 is a tapered coupler. In some embodiments, vertical coupler 206 is an asymmetric directional coupler. In some embodiments, additional processing of semiconductor layer 422 is performed to fabricate photonic devices, such as modulators, detectors, attenuators, and the like.

As discussed above, in some embodiments, active layer 418 is a compound semiconductor layer or layers, which enables formation of active devices, such as lasers, amplifiers, etc., in semiconductor layer 422.

FIG. 4F depicts a portion of substrate 400 after semiconductor layer 422 has been patterned to define waveguide core 224.

Figure 6:
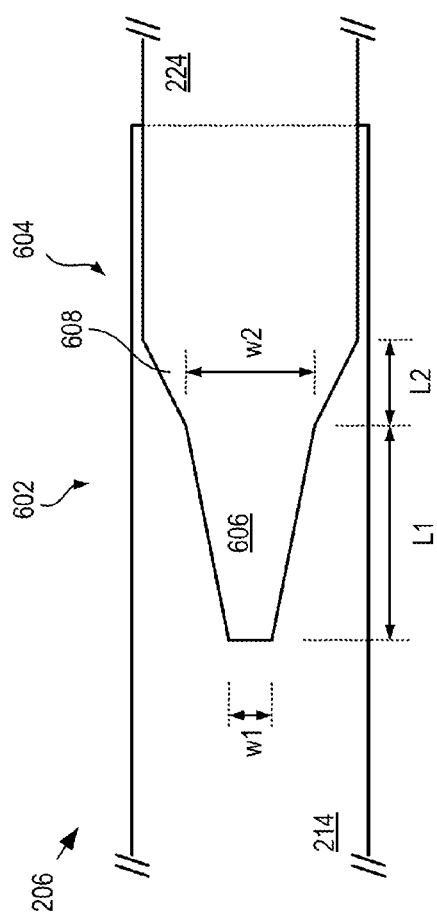
FIG. 6 depicts a schematic drawing of a top view of a vertical coupler in accordance with the illustrative embodiment of the present invention.

FIG. 6 depicts a schematic drawing of a top view of a vertical coupler in accordance with the illustrative embodiment of the present invention. Vertical coupler 206 comprises portion 602 of dielectric core 214 and coupling portion 604 of waveguide core 224.

Portion 602 is a portion of dielectric core 214 that overlaps with coupling portion 604. The length of portions 602 and 604 is a matter of design choice.

Coupling portion 604 includes a portion of waveguide core 224, coupling taper 606, and mode-confinement taper 608.

Coupling taper 606 is a portion of waveguide core 224 that increases in width along its length, L1, from width w1 at its tip to width w2 where it meets mode-confinement taper 608. Coupling taper 606 enables the fundamental TE mode of dielectric core 214 to couple into waveguide core 224. The dimensions of L1, w1, and w2 are matters of design choice; however, exemplary dimensions for these parameters include L1=200 microns, w1=400 nm, and w2=600 nm.

Mode-confinement taper 608 is a portion of waveguide core 224 that increases the confinement of the mode in the silicon waveguide. The increased confinement enables tighter waveguide bends, and the higher-aspect-ratio core geometry decreases the sidewall scattering loss. Mode-confinement taper 608 increases in width along its length, L2, from width w2 to the width of waveguide core 224. The length of L2 is also a matter of design choice; however, an exemplary length L1 is 100 microns.

Figures 7A, 7B:
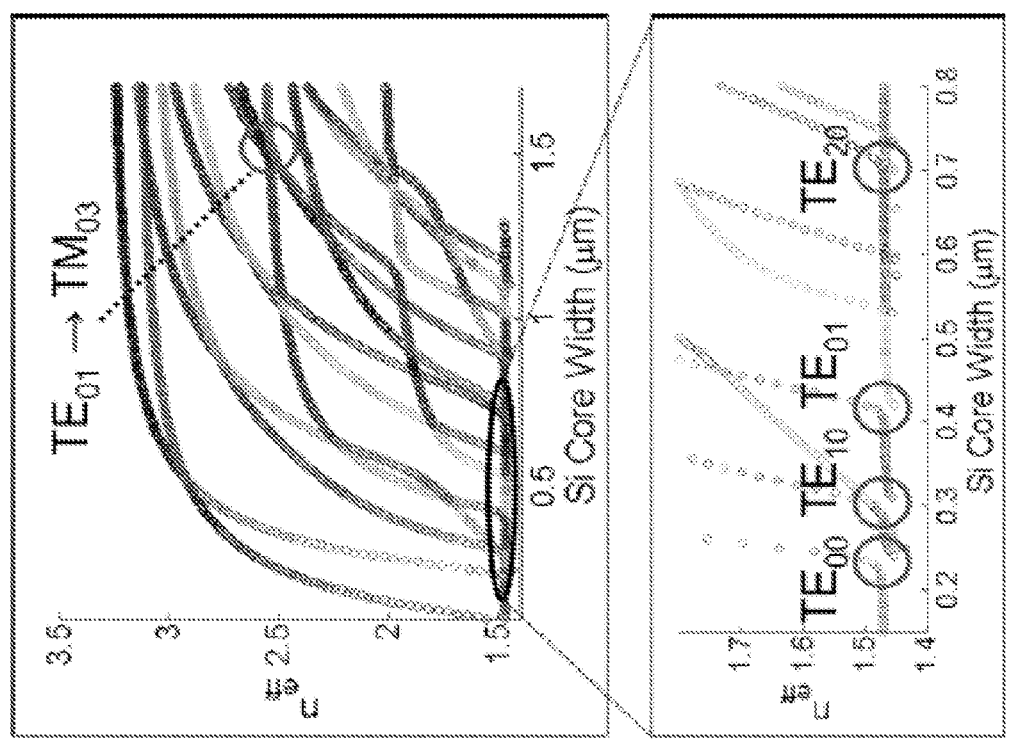
FIG. 7A depicts the effective mode indices of an asymmetric twin waveguide structure as a function of the width of a silicon waveguide.
FIG. 7B is an inset that depicts the relationship between the effective mode indices and waveguide width near the effective index (1.48) of the fundamental TE mode of an ultra-low-loss dielectric waveguide.

FIG. 7A depicts the effective mode indices of an asymmetric twin waveguide structure as a function of the width of a silicon waveguide.

FIG. 7B is an inset that depicts the relationship between the effective mode indices and waveguide width near the effective index (1.48) of the fundamental TE mode of an ultra-low-loss dielectric waveguide.

Circles indicate widths if waveguide core 224 where perturbations between dielectric waveguide 202 and semiconductor waveguide 204 occur. By tapering the width of waveguide core 224 around one of these perturbation regions, power can be efficiently transferred from one mode (or waveguide) to the other. As shown in FIGS. 7A and 7B, the fundamental TE mode of an ultra-low-loss waveguide can couple to the fundamental TE mode, as well as many higher order TE modes, of a silicon waveguide depending on the values of w1 and w2. For the data depicted in plot 700, coupling tapers with w1 values of 400 and 600 nm are characterized. In each case, w2 is 200 nm wider than w1.

It will be clear to one skilled in the art, after reading this Specification, that via appropriate coupler design, the present invention enables coupling between dielectric waveguide 202 and semiconductor waveguide 204 wherein:
 i. a fundamental optical mode couples to a fundamental optical mode; or
 ii. a fundamental optical mode couples to higher-order optical modes; or
 iii. higher-order optical modes couple to a fundamental optical mode; or
 iv. one polarization couples to a transverse polarization; or
 v. any combination of i, ii, iii, and iv.

Figure 4C:
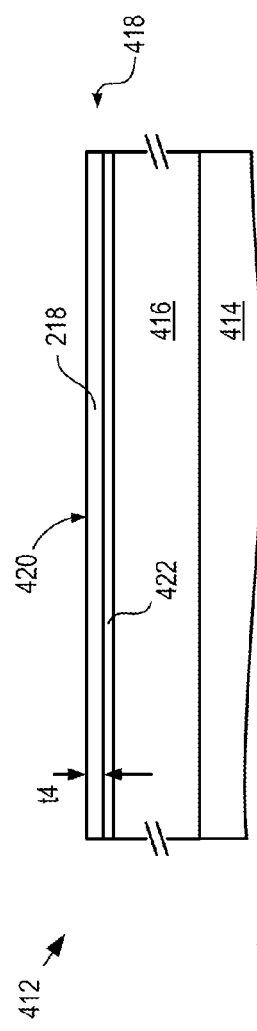

Returning now to FIGS. 2-4, at operation 310, photonic substrate 428 is bonded to substrate 400. Photonic substrate 428 comprises handle substrate 426 and epitaxial layer structure 430.

FIG. 4G depicts a portion of substrate 400 after photonic substrate 428 and substrate 400 are bonded.

Handle substrate 426 is a conventional indium phosphide (InP) wafer on which epitaxial layers suitable for photonic device 208 (i.e., epitaxial layer structure 430) have been grown. In some embodiments, handle substrate 426 comprises a material other than InP. Materials suitable for use as handle substrate 426 include, without limitation, compound semiconductors (e.g., III-V or II-V compound semiconductors), germanium, germanium-on-silicon substrates, compound semiconductor-on-silicon substrates, and the like.

Epitaxial layer structure 430 comprises, among other layers, cladding layers, carrier confinement layers, a multiple-quantum-well (MQW) gain layer, and interface layer 228 suitable for forming, with waveguide core 224, a heterogeneous silicon laser. In some embodiments, epitaxial layer structure 430 is partially processed prior to the bonding operation that joins substrates 400 and 428. For example, in some embodiments, one or more regions of epitaxial layer structure 430 are etched to physically separate different portions of the structure, proton implantation is performed in some regions of the device structure, quantum-well intermixing is performed in some regions of the device structure, etc.

In the illustrative embodiment, epitaxial layer structure 430 includes a layer structure suitable for forming a heterogeneous silicon laser; however, one skilled in the art will recognize, after reading this Specification, that epitaxial layer structure 430 can include layers suitable for forming any suitable III-V or II-VI photonic device structure, such as an amplifier, variable optical attenuator, photodetector, modulator, etc. It will be clear to one skilled in the art, after reading this Specification, how to specify, make, and use alternative embodiments of the present invention wherein epitaxial layer structure 430 and waveguide core 224 collectively define another heterogeneous silicon device, such as a modulator, DFB laser, micro-ring resonator, and the like. In some embodiments, epitaxial layer structure 430 includes layers suitable for forming combinations of photonic devices. In some embodiments, epitaxial layer structure 430 includes layers suitable for forming device structures suitable for forming conventional photonic devices, such as photodetectors, modulators, semiconductor optical amplifiers, etc.

In some embodiments, epitaxial layer structure 430 comprises layers suitable for forming a different semiconductor structure, such as an amplifier, modulator, photodetector, etc. In some embodiments, epitaxial layer structure 430 includes layers suitable for forming a plurality of photonic devices. In some embodiments, epitaxial layer structure 430 comprises a material system other than InP, such as another III-V material system or a II-VI material system. In some embodiments, epitaxial layer structure 430 comprises a structure other than an MQW, such as a single quantum well, quantum dot, quantum dash, bulk gain layer, quantum cascade gain material, interband cascade gain material, bulk gain material, and the like, wherein the bandgap can be above or below the operating wavelength of the device.

In some embodiments, epitaxial layer structure 430 includes one or more regions that are quantum-well intermixed regions whose bandgap differs from its as-grown bandgap.

Interface layer 228 is an n-InP/n-InGaAsP super-lattice layer that enables the flow of electrical current through the laser structure. Interface layer 228 also acts as a barrier for defects that could migrate into epitaxial layer structure 430 from bonded interface 220 during the bonding of substrate 400 and photonic substrate 428. Interface layer 228 is also suitable for direct bonding with waveguide core 224 via wafer bonding (e.g., low-temperature oxygen-plasma-assisted wafer bonding, etc.).

It should be noted that, in some embodiments, epitaxial layer structure 430 is bonded directly to dielectric core 214 without requiring the intervening layers of cladding 222 and active layer 422.

The layers of epitaxial layer structure 430 and waveguide core 224 collectively support an optical mode that, depending on the design of waveguide core 224, can reside anywhere from primarily within the compound semiconductor layer structure to primarily within semiconductor waveguide 204. Embodiments of the present invention typically include a semiconductor waveguide that supports most, or all, of the optical mode in semiconductor waveguide 204 so as to substantially maximize the optical coupling between epitaxial layer structure 430 and dielectric waveguide 202 (via semiconductor waveguide 204).

At operation 311, substrate 426 is removed via a conventional substrate removal technique, such as wet chemical etching, jet etching, etc.

FIG. 4H depicts a portion of substrate 400 after removal of handle substrate 426.

At operation 312, epitaxial layer structure 430 is processed further to complete the fabrication of photonic device 208. After its completion, epitaxial layer structure 430 and waveguide core 224 collectively define a heterogeneous silicon laser. Post-bonding processing of epitaxial layer structure 430 includes, for example, etching to form mesa structure 226, metallization to form contacts 232 and 234, proton implantation, etc. In some embodiments, at least one electronic device is formed in one or more of the layers of epitaxial layer structure 430.

In some embodiments compound semiconductor material is directly bonded to the waveguide core 224 and is later processed to form photonic devices.

Figure 8:
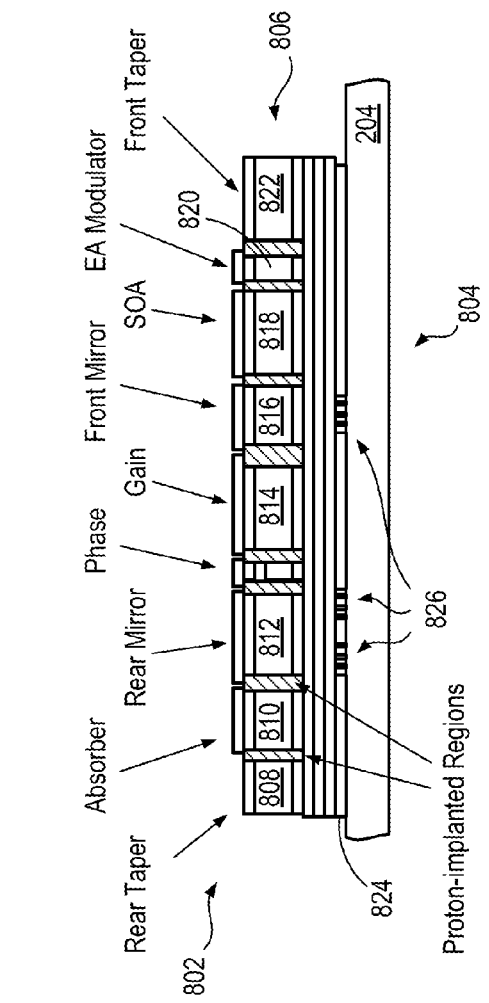
FIG. 8 depicts a schematic diagram of a quantum-well-intermixed device integrated and optically coupled with a silicon waveguide in accordance with a first alternative embodiment of the present invention.

FIG. 8 depicts a schematic diagram of a quantum-well-intermixed device integrated and optically coupled with a silicon waveguide in accordance with a first alternative embodiment of the present invention. System 800 includes device 802 and waveguide portion 804. Quantum-well-intermixed devices suitable for use in the present invention are disclosed by Skogen, et al., in "Postgrowth control of the quantum-well band edge for the monolithic integration of widely tunable lasers and electroabsorption modulators," *IEEE Journal of Selected Topics in Quantum Electronics*, Vol. 9, pp. 1183-1190 (2003), and U.S. Patent Publication 2009/0246298-A1, each of which is incorporated herein by reference.

Device 802 is a tunable transmitter that includes a widely tunable, sampled-grating, distributed-Bragg-reflector (DBR) laser formed from MQW layer 806. MQW layer 806 is characterized by an "as-grown" bandgap.

Region 814 is a region of MQW layer that has not been subjected to a quantum-well intermixing process. As a result, region 814 is characterized by the as-grown bandgap of MQW layer 806. Region 814 defines a gain region for the DBR laser.

In regions 808, 810, 812, 816, 818, 820, and 822, however, layer 806 is subjected to a quantum-well-intermixing process to define regions having different bandgaps by virtue of different durations of quantum-well intermixing. As a result, regions 808, 810, 812, 816, 818, 820, and 822 serves as one of a III-V taper region, absorber, mirror, phase control section, or gain control section. Collectively, with gain region 814, these sections collectively define a widely tunable, sampled-grating, DBR laser.

Interface layer 824 is analogous to interface layer 228, described above; however, interface layer 824 includes etched mirror regions 826.

Device 802 is bonded to waveguide portion 804 as described above.

It should be noted that many III-V materials can be directly bonded to silicon or silicon dioxide using plasma-assisted bonding. As a result, it is an aspect of the present invention that epitaxial layer structure 430 can be directly bonded to a silicon dioxide cladding layer, such as cladding portion 216 or cladding layer 222.

FIG. 9A depicts a schematic diagram of a cross-sectional view of a photonic device integrated with a silicon dioxide cladding layer in accordance with a second alternative embodiment of the present invention. System 900 includes device 902 and waveguide 904.

Device 902 is an InP-based photonic device comprising n-type InP layer 910, quantum-well layer 912, and p-type InP layer 914, among other layers. Device 902 is representative of any suitable III-V or II-VI device, such as a laser, amplifier, variable optical attenuator, photodetector, modulator, and the like. In some embodiments, device 902 comprises a structure other than a quantum well, such as a quantum dot, etc.

Device 902 includes an electrical path between contacts 918 and 920. Electrical carrier confinement is achieved by forming non-conductive regions 916 via conventional proton implantation. It should be noted that proton implantation is merely one example of a suitable method for providing electrical isolation between III-V regions. Other electrical isolation methods include, for example, trench isolation, etching narrow ridges in the compound semiconductor material, etc.

Waveguide 904 is an ultra-low-loss dielectric waveguide comprises lower cladding 212, dielectric core 214, cladding portion 216, and thermal oxide 906.

Thermal oxide 906 is formed in analogous fashion to cladding portion 219 described above; however, in some embodiments, thermal oxide 906 is formed in a conventional silicon substrate. In some embodiments, thermal oxide 906 has a thickness greater than one micron.

Thermal oxide 906 is bonded to cladding portion 216 via oxygen-plasma-assisted bonding to form bonded interface 908. The bonded oxide layers are then annealed to improve the strength and quality of the interface. As a result, cladding portion 216 and thermal oxide 906 collectively define a thick, high-quality silicon dioxide film suitable for use as the upper cladding for ultra-low-loss dielectric waveguide 904. After bonding, the silicon substrate (or SOI substrate used to form the thermal oxide is removed leaving a top surface suitable for high-quality plasma-assisted bonding with n-type InP layer 910.

Photonic device 902 is optically coupled with dielectric waveguide 904 through upper cladding 216.

FIG. 9B depicts a schematic drawing of a perspective view of a vertical coupler suitable for optically coupling device 902 and waveguide 904.

Tapered regions 922, 924, and 926 are formed in layers 910, 912, and 914, respectively to facilitate good optical coupling between device 902 and waveguide 904.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A method comprising:
   providing a dielectric waveguide structure disposed on a first substrate (210), the dielectric waveguide structure comprising;
   (a) a first waveguide core (214), the first waveguide core having a first refractive index; and
   (b) a first dielectric layer (216), the first dielectric layer having a second refractive index that is lower than the first refractive index, the first waveguide core being between the first substrate and the first dielectric layer;
   providing a second substrate comprising a handle wafer (414), a semiconductor layer (422), and a second dielectric layer (218) having a third refractive index that is lower than the first refractive index;
   bonding the first dielectric layer and the second dielectric layer at a bonded interface (220) to collectively define a cladding layer (222) for the first waveguide core, wherein the first waveguide core and a first region (604) of the semiconductor layer are optically coupled through the cladding layer; and
   removing the handle wafer.

2. The method of claim 1 wherein the dielectric waveguide structure is provided such that the dielectric waveguide is characterized by a propagation loss less than or equal to 0.1 dB per meter.

3. The method of claim 1 further comprising defining a second waveguide core (224) in the semiconductor layer, the second waveguide core including a second region (224) of the semiconductor layer.

4. The method of claim 3 wherein the second waveguide core is defined such that the second region includes the first region.

5. The method of claim 1 further comprising:
providing the second substrate such that the semiconductor layer (422) comprises silicon and the second dielectric layer (218) comprises silicon dioxide;
defining a second waveguide core (224) in the semiconductor layer (422), the second waveguide core including the first region (604);
providing a compound semiconductor layer structure (430) that includes at least one quantum well; and
bonding the compound semiconductor layer structure and the second waveguide core such that the at least one quantum well and the second waveguide core are evanescently coupled, wherein the compound semiconductor layer structure and the second waveguide core collectively define at least one heterogeneous silicon device (208).

6. The method of claim 5 wherein the compound semiconductor layer structure is provided such that it includes at least one quantum-well-intermixed region (816).

7. The method of claim 1 further comprising forming an electronic device (230), the electronic device comprising a second region of the semiconductor layer.

8. The method of claim 1 further comprising providing the second substrate such that the semiconductor layer comprises a compound semiconductor (910).

9. The method of claim 8 further comprising:
providing a compound semiconductor layer structure (430) that includes the semiconductor layer (910); and
defining a photonic device (902) in the compound semiconductor layer structure, wherein the photonic device is optically coupled with the first region.

10. A composition comprising:
a first waveguide (202), the first waveguide including;
(1) a first waveguide core (214) having a first refractive index, the first waveguide core being disposed on a first cladding layer (212) that is disposed on a substrate (210); and
(2) a second cladding layer (222) having a bonded interface (220), the second cladding layer including;
(i) a first dielectric layer (216) having a second refractive index that is lower than the first refractive index; and
(ii) a second dielectric layer (218) having a third refractive index that is lower than the first refractive index;
wherein the first dielectric layer and second dielectric layer are bonded at the bonded interface, and wherein the first waveguide core is between the substrate and the second cladding layer; and
a semiconductor layer (422) disposed on the second cladding layer;
wherein the first waveguide core and a first region (604) of the semiconductor layer are optically coupled through the second cladding layer.

11. The composition of claim 10 wherein the first waveguide is a dielectric waveguide characterized by a propagation loss less than or equal to 0.1 dB per meter.

12. The composition of claim 10 further comprising an electronic device (230), the electronic device comprising a second region of the semiconductor layer.

13. The composition of claim 10 further comprising a second waveguide core (224) having a fourth refractive index that is higher than each of the second and third refractive indices, the second waveguide core including a second region of the semiconductor layer.

14. The composition of claim 13 wherein the second region includes the first region.

15. The composition of claim 14 further comprising a photonic device (208) that is optically coupled with the first waveguide (202) via the second waveguide core (224).

16. The composition of claim 13 wherein the first waveguide is dielectric waveguide characterized by a propagation loss less than or equal to 1 dB per meter, and wherein the second waveguide core comprises silicon.

17. The composition of claim 16 further comprising a compound semiconductor structure (430) that includes at least one quantum well, the compound semiconductor structure being bonded with the second waveguide core such that the second waveguide core and the at least one quantum well are evanescently coupled.

18. The composition of claim 17 wherein the compound semiconductor structure comprises at least one quantum-well intermixed region (816).

19. The composition of claim 17 wherein the compound semiconductor structure (430) and the second waveguide core (224) collectively define at least one silicon-evanescent photonic device (208).

20. The composition of claim 13 further comprising a photonic device (208) that is optically coupled with the first waveguide core (214).

* * * * *